US 6,748,181 B2

(12) United States Patent
Miki et al.

(10) Patent No.: US 6,748,181 B2
(45) Date of Patent: Jun. 8, 2004

(54) OPTICAL TRANSMITTER PROVIDED WITH OPTICAL OUTPUT CONTROL FUNCTION

(75) Inventors: Makoto Miki, Sapporo (JP); Toru Matsuyama, Sapporo (JP); Hiroki Kanesaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/953,860

(22) Filed: Sep. 18, 2001

(65) Prior Publication Data

US 2002/0118424 A1 Aug. 29, 2002

Related U.S. Application Data

(63) Continuation of application No. PCT/JP01/01375, filed on Feb. 23, 2001.

(51) Int. Cl.[7] .............................................. H04B 10/04
(52) U.S. Cl. ....................... 398/195; 398/182; 398/183; 398/196; 398/197; 398/198; 372/29; 372/32; 372/34; 372/36; 372/38; 372/35
(58) Field of Search ................................ 398/182, 183, 398/195, 196, 197, 198; 372/29, 32, 34, 38, 36, 35

(56) References Cited

U.S. PATENT DOCUMENTS

| | | | | |
|---|---|---|---|---|
| 4,558,465 A | * | 12/1985 | Siegel et al. | 455/609 |
| 5,073,838 A | * | 12/1991 | Ames | 361/103 |
| 5,309,269 A | * | 5/1994 | Shibao | 359/187 |
| 5,502,298 A | * | 3/1996 | Geller | 250/205 |
| 5,548,435 A | * | 8/1996 | Tahara et al. | 359/180 |
| 5,812,572 A | * | 9/1998 | King et al. | 372/38 |
| 5,917,637 A | * | 6/1999 | Ishikawa et al. | 359/181 |
| 5,978,124 A | * | 11/1999 | Maekawa et al. | 359/187 |
| 5,978,393 A | * | 11/1999 | Feldman et al. | 372/31 |
| 6,188,498 B1 | * | 2/2001 | Link et al. | 359/187 |
| 6,192,060 B1 | * | 2/2001 | Kobayashi | 372/38 |
| 6,195,371 B1 | * | 2/2001 | Haneda et al. | 372/29.01 |
| 6,219,165 B1 | * | 4/2001 | Ota et al. | 359/187 |
| 6,292,497 B1 | * | 9/2001 | Nakano | 372/29.015 |

FOREIGN PATENT DOCUMENTS

| | | |
|---|---|---|
| EP | 0 583 186 A1 | 2/1994 |
| EP | 0 793 316 A1 | 9/1997 |
| JP | 64-013782 | 1/1989 |
| JP | 04-152582 | 5/1992 |
| JP | 06-061555 | 3/1994 |
| JP | 06-090046 | 3/1994 |
| JP | 09-162811 | 6/1997 |
| JP | 11-135871 | 5/1999 |

\* cited by examiner

*Primary Examiner*—Leslie Pascal
*Assistant Examiner*—Hanh Phan
(74) *Attorney, Agent, or Firm*—Staas & Halsey LLP

(57) ABSTRACT

The present invention aims at providing a low cost optical transmitter capable of controlling, with a high precision, fluctuations in optical output characteristic of a semiconductor light emitting device such as due to a temperature change. To this end, the optical transmitter of the present invention is constituted to comprise; a semiconductor light emitting device; a driving circuit for supplying a driving current to the semiconductor light emitting device; an optical output detecting section for detecting an optical output power of the semiconductor light emitting device; a storing section for storing temperature characteristic information including temperature characteristic data concerning the driving current to be supplied to the semiconductor light emitting device and temperature characteristic data concerning the optical output detecting section; a temperature detecting section for detecting temperature; and a controlling section for controlling the operation of the driving circuit, based on the temperature characteristic information read out from the storing section corresponding to the temperature detected by the temperature detecting section and based on the detection result of the optical output detecting section.

12 Claims, 10 Drawing Sheets

OPTICAL TRANSMITTER PROVIDED WITH OPTICAL OUTPUT CONTROL FUNCTION

This application is a continuation of PCT/JP01/01375 filed on Feb. 23, 2001.

BACKGROUND OF THE INVENTION

The present invention relates to an optical transmitter for converting an electrical signal into an optical signal by utilizing a semiconductor light emitting device such as a laser diode (LD) or a light emitting diode (LED) to transmit the optical signal, and particularly to a controlling technique for suppressing fluctuations in optical output characteristics of the semiconductor light emitting device due to temperature changes and the like.

Characteristics of semiconductor light emitting devices to be utilized in optical transmitters are changed corresponding to temperatures, and such temperature characteristics are different from one another, among individual semiconductor light emitting devices to be used. As such, it has been basically required for conventional optical transmitters to individually conduct adjustment of an optical output power, thereby resulting in problems of an increase in circuit size due to an increased number of adjusting parts and an increase in cost due to individual adjustment.

As a conventional technique for solving the aforementioned problems, there has been known a technique such as described in Japanese Unexamined Patent Publication No. 9-162811. This conventional technique is constituted to previously obtain temperature characteristic data concerning a laser diode and its driving circuit, store the obtained data into an optical transmitter itself, as characteristic information for control, select from the stored data characteristic information corresponding to the temperature and a targeted optical output, and control a driving current to be supplied to the laser diode from the driving circuit. In this way, it is intended to overcome, for example, a deterioration of light extinction or a delay in light emission due to the difference between the temperature characteristic of the laser diode and the temperature characteristic of the circuit for drive controlling the laser diode In the aforementioned conventional optical transmitter, however, the temperature characteristic data as the characteristic information to be previously stored in the optical transmitter include only the driving currents (specifically, forward current and threshold current) of the laser diode, obtained corresponding to a predetermined ambient temperature and predetermined optical outputs. Therefore, it is difficult to precisely control fluctuations of the optical output power due to temperature changes.

Namely, the control of an optical output power to be performed in the conventional optical transmitter is such that the optical power to be output from the laser diode is detected by a monitoring photodiode (hereinafter called "monitoring PD"), and the detected optical output power is compared with a fixed reference signal (electric cell) to control the driving current to the laser diode, so that the resultant difference obtained by the comparison is compensated for. It has been known that the monitoring PD has a photoelectric conversion efficiency which changes in a temperature dependent manner such as shown in FIG. 12. However, such a temperature characteristic of the monitoring PD has been neglected in the conventional control technique, because a variation amount of the temperature characteristic of the monitoring PD is typically smaller than a variation amount of the temperature characteristic of the laser diode. However, if the optical output power is to be controlled with a higher precision, the variation due to the temperature characteristic of the monitoring PD can never be neglected, thereby requiring a controlling technique taking account of even the temperature characteristic of the monitoring PD.

Further, in the optical output power control in the conventional optical transmitter, a so-called feedforward control is performed, in which an APC (automatic power control) using the detection result of the monitoring PD is executed only for the threshold current while a modulation current is directly controlled by the characteristic information read out from the stored data. However, it is difficult to discriminate as to whether the change of the optical output characteristic of the laser diode such as due to deterioration with time lapse is caused by the threshold current or by the modulation current. Therefore, it is difficult to perform characteristic compensation over a long time such as 25 years, by merely performing a feedback control such as the APC for the threshold current.

Moreover, in the conventional optical transmitter, to prepare the characteristic information to be stored, temperature characteristic data is obtained while changing the surrounding temperature over a required temperature range at a predetermined rate. However, to realize an optical output power control with a higher precision in such a characteristic information preparing method, it is necessary to obtain an extremely large number of temperature characteristic data. Therefore, a long period of time is required to adjust the optical transmitter, thereby causing an increase in cost due to an increase in the number of adjusting steps.

The present invention has been carried out in view of the conventional problems as described above, and it is therefore an object of the present invention to provide a low cost optical transmitter capable of highly precisely controlling fluctuations of optical output characteristics of semiconductor light emitting device due to temperature changes and the like.

SUMMARY OF THE INVENTION

To this end, with the present invention, an optical transmitter comprising: a semiconductor light emitting device; a driving circuit for supplying a driving current to the semiconductor light emitting device; an optical output detecting section for detecting an optical output power of the semiconductor light emitting device; and a controlling section for controlling the operation of the driving circuit based on a detection result of the optical output detecting section, further comprises: a storing section for storing temperature characteristic information including temperature characteristic data concerning the driving current to be supplied to the semiconductor light emitting device and temperature characteristic data concerning the optical output detecting section; and a temperature detecting section for detecting temperature; wherein the controlling section controls the operation of the driving circuit, based on the temperature characteristic information read out from the storing section corresponding to the temperature detected by the temperature detecting section and based on the detection result of the optical output detecting section.

In such an optical transmitter, the temperature characteristic information including the respective temperature characteristic data concerning the driving current of the semiconductor light emitting device and concerning the optical output detecting section are previously stored in the storing section, and the temperature characteristic information in the storing section is road out by the controlling section corresponding to the temperature detected by the temperature detecting section. Then, based on the read out temperature characteristic information, in the controlling section, the operation control of the driving circuit is performed while compensating for errors corresponding to temperature changes concerning the detection result of the optical output detecting section. Thereby, it becomes possible to control, with a high precision, fluctuations in temperature of the optical output power of the semiconductor light emitting device.

As a specific constitution of the optical transmitter, when the semiconductor light emitting device is a laser diode, the storing section may store therein, as the temperature characteristic information, temperature characteristic data respectively corresponding to a threshold current and a modulation current, both to be supplied to the laser diode, and temperature characteristic data of a monitoring current to be output from a light receiving element to be used in the optical output detecting section. Further, it is preferable that the controlling section of The optical transmitter feedback controls at least one of the threshold current and modulation current to be supplied from the driving circuit to the laser diode, such that the temperature characteristic data of the monitoring current read out from the storing section corresponding to the temperature detected by the temperature detecting section coincides with a monitoring current value corresponding to the optical output power detected by the optical output detecting section. When both of the threshold current and modulation current are feedback controlled, it is possible to control the operation of the driving circuit such that a value of ratio between the threshold current and modulation current in optimized at each temperature. When one of the threshold current and modulation current is feedback controlled, it is possible to feedforward control the other of the threshold current and modulation current, based an only the temperature characteristic information read out from the storing section corresponding to the temperature detected by the temperature detecting section.

According to such specific constitutions, the driving current of the laser diode which corresponds to the sum of the threshold current and modulation current is feedback controlled by the controlling section, thereby enabling to control with a high precision the optical output power of the laser diode to a required level. Note, it is also possible that the semiconductor light emitting device is a light emitting diode in the aforementioned optical transmitter, in which the optical output power of the light emitting diode can be controlled with a high precision.

Further, the temperature characteristic information to be stored in the storing section may be obtained by utilizing approximate expressions defined based on the data measured at temperatures of at least three over a working temperature range of the optical transmitter. Thereby, it becomes possible to obtain the temperature characteristic information with a higher precision concerning the working temperature range of the optical transmitter even when the number of measuring points of the temperature characteristic data is relatively less, thereby enabling to shorten the time required for the adjusting operation of the optical transmitter.

Moreover, the optical transmitter may further comprise: a driving current monitoring circuit capable of detecting an increase or decrease in the driving current to be supplied to the semiconductor light emitting device, by comparing the data corresponding to the temperature detected by the temperature detecting section, among the temperature characteristic data concerning the driving current stored in the storing section, with the driving current generated by the driving circuit. In addition, the optical transmitter may further comprise an optical output monitoring circuit capable of detecting a fluctuation in the optical output power of the semiconductor light emitting device, by comparing the data corresponding to the temperature detected by the temperature detecting section, among the temperature characteristic data concerning the optical output detecting section stored in the storing section, with the information concerning the optical output power detected by the optical output detecting section.

The above constitution makes it possible to monitor the driving state of the semiconductor light emitting device such as from the exterior, and can be utilized such as for sending an alarm when there occurs an abnormality in the driving current or in the optical output power.

BEST MODE FOR CARRYING OUT THE INVENTION

There will be described hereinafter embodiments according the present invention, with reference to the accompanying drawings.

Figure 1:
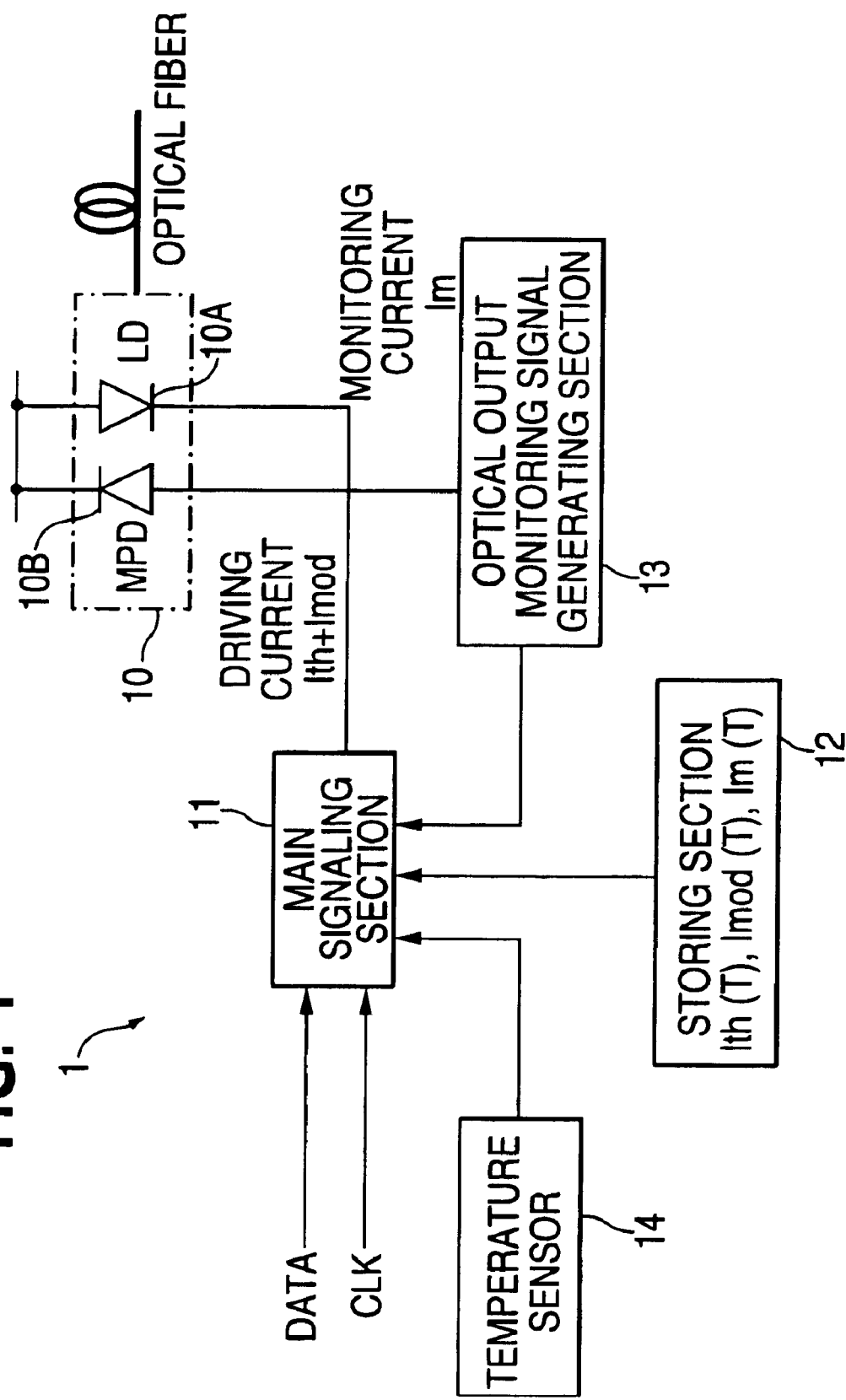
FIG. 1 is a functional block diagram showing a basic constitution of an optical transmitter according to the present invention.

FIG. 1 is a functional block diagram showing a basic constitution of an optical transmitter according to the present invention.

In FIG. 1, an optical transmitter 1 comprises, for example, an LD module 10 having a laser diode (LD) 10A and a monitoring PD (MPD) 10B, a main signaling section 11 for driving the laser diode 10A, a storing section 12 for storing therein temperature characteristic information concerning the laser diode 10A and its driving circuit (the main signaling section 11 in this case) as well as temperature characteristic information concerning the monitoring PD 10B, an optical output monitoring signal generating section 13 for generating an optical output monitoring signal based on an output signal from The monitoring PD 10B to transmit the optical output monitoring signal to the main signaling section 11, and a temperature sensor 14 As a temperature detecting section for detecting temperature.

The laser diode 10A is a general semiconductor light emitting device for converting a driving current supplied by The main signaling section 11 into an optical signals to output the optical signal to an optical fiber. The monitoring PD 10B is an optical receiver for detecting an optical output power of the laser diode 10A, and may be specifically a light receiving element such as for receiving the rearward emission light from the laser diode 10A to convert the light into an electric current signal. Herein, a typical LD module 10 modularizing the laser diode 10A and monitoring PD 10B is used.

The main signaling section 11 is an electric circuit having a function to generate a driving current to be supplied to the laser diode 10A, according to a data signal DATA and a clock signal CLK such as input from the exterior of the optical transmitter 1, and to adjust the level of the driving current, based on the temperature characteristic information read out from the storing section 12, the optical output monitoring signal to be transmitted from the optical output monitoring signal generating section 13, and a temperature monitoring signal to be transmitted from the temperature sensor 14. Thus, the main signaling section 11 corresponds to a driving circuit and a controlling section, herein.

Figure 2:
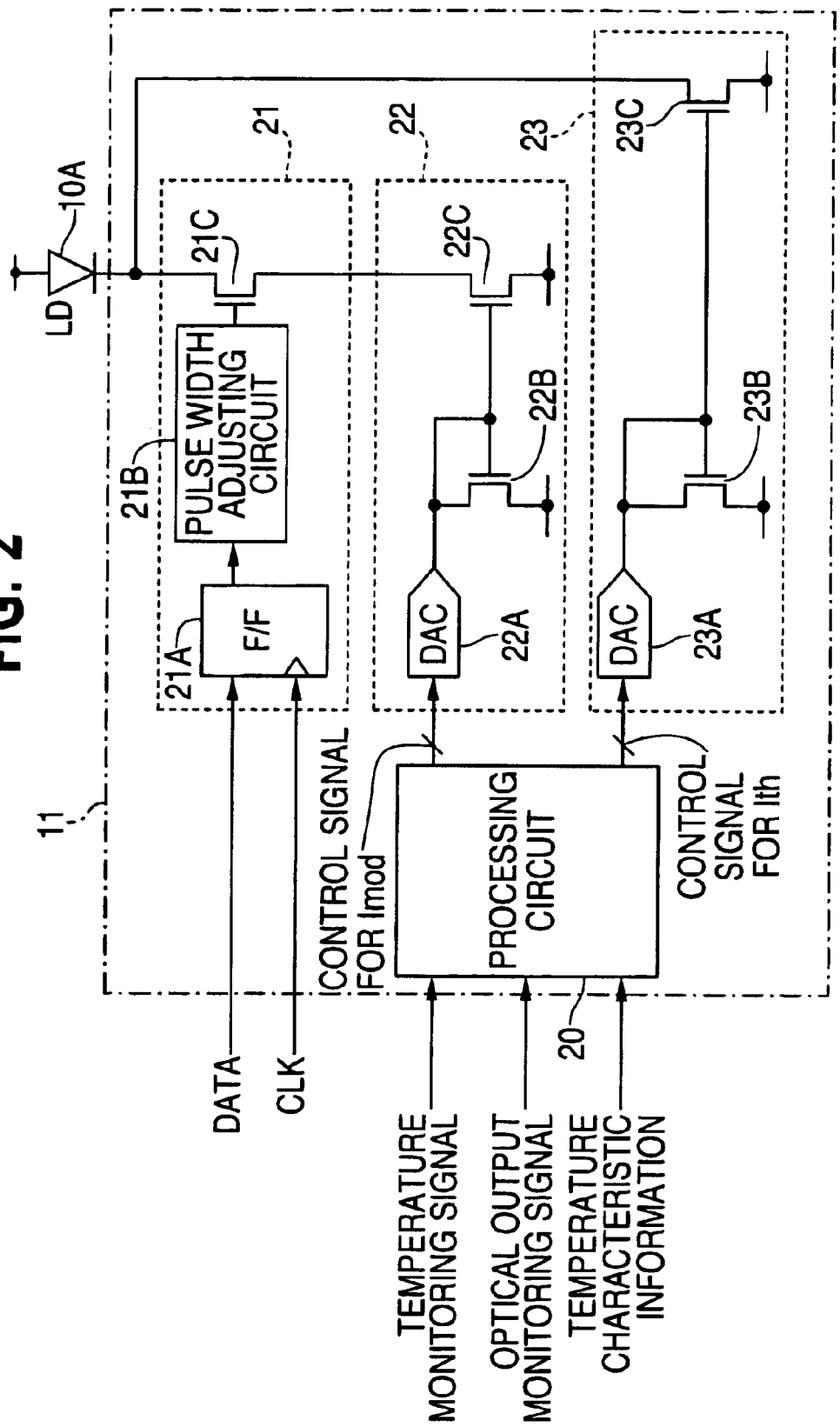
FIG. 2 is a circuit diagram showing a specific constitution example of a main signaling section to be used in the optical transmitter of FIG. 1.

FIG. 2 is a circuit diagram showing a specific constitution example of the main signaling section 11.

In the constitution example of FIG. 2, the main signaling section 11 is constituted to comprise a processing circuit 20, an ON/OFF controlling circuit 21 for switching a light emitting state and a light extinguishing state, by controlling the driving current to be supplied to the laser diode 10A according to the data signal DATA and clock signal CLK sub as supplied from the exterior, and a modulation current controlling circuit 22 and a threshold current controlling circuit 23 capable of controlling values of modulation current Imod and threshold current Ith, respectively, corresponding to output information from the processing circuit 20.

The processing circuit 20 receives the optical output monitoring signal from the optical output monitoring signal generating section 13 and the temperature monitoring signal from the temperature sensor 14, reads out, corresponding to the input temperature monitoring signal, the temperature characteristic information stored in the storing section 12, and, based on the read out temperature characteristic information and the input optical output monitoring signal, generates and outputs controlling signals for controlling the respective values of the modulation current Imod and threshold, current Ith. A specific method for generating the controlling signals shall be detailed later.

The ON/OFF controlling circuit 21 includes a flip-flop (F/F) circuit 21A, a pulse width adjusting circuit 21B and a MOSFET 21C, for example. The flip-flop circuit 21A conducts re-timing of the data signal DATA such as input from the exterior, by the clock signal CLK. The pulse width adjusting circuit 21B adjusts the pulse width of an output signal from the flip-flop circuit 21A. The MOSFET 21C has a gate terminal connected to an output terminal of the pulse width adjusting circuit 21B and a drain terminal connected to a cathode terminal of the laser diode 10A, to be turned ON/OFF according to an output signal of the pulse width adjusting circuit 21B.

The modulation current controlling circuit 22 includes a D/A converter (DAC) 22A and MOSFET's 22B, 22C, for example. The D/A converter 22A converts, from digital to analog, the controlling signal concerning the modulation current Imod output from the processing circuit 20,. The MOSFET 22B is diode-connected and is input with an output signal from the D/A converter 22A. The MOSFET 22C has a gate terminal connected to a gate terminal of the MOSFET 22B and a drain terminal connected to a source terminal of the MOSFET 21C, to control the value of the modulation current Imod corresponding to a signal input to the gate terminal of MOSFET 22C itself.

The threshold current controlling circuit 23 includes a D/A converter (DAC) 23A and MOSFET's 23B, 23C, for example. The D/A converter 23A converts, from digital to analog, the controlling signal concerning the threshold current Ith output from the processing circuit 20. The MOSFET 23B is diode-connected and is input with an output signal from the D/A converter 23A. The MOSFET 23C has a gate terminal connected to a gate terminal of the MOSFET 23B and a drain terminal connected to a cathode terminal of the LD 10A, to control the value of the threshold current Ith corresponding to a signal to be input to the gate terminal of the MOSFET 23C itself.

The storing section 12 in FIG. 1 stores therein the temperature characteristic information including temperature characteristic data concerning the laser diode 10A and the main signaling section 11 acting as the driving circuit of the laser diode 10A, and temperature characteristic data concerning the monitoring PD 10B. As a specific example of the temperature characteristic information herein, the storing section 12 stores therein temperature characteristic data Imod(T) and temperature characteristic date Ith(T) concerning the modulation current Imod and threshold current Ith in the driving current to be supplied to the laser diode 10A, respectively, and temperature characteristic data Im(T) concerning the monitoring current Im of the monitoring PD 10B. The respective temperature characteristic data Imod(T), Ith(T) Im(T) have been previously obtained over a required temperature range, such as by measuring. Note, a specific method for creating the temperature characteristic information shall be detailed later.

Figure 3:
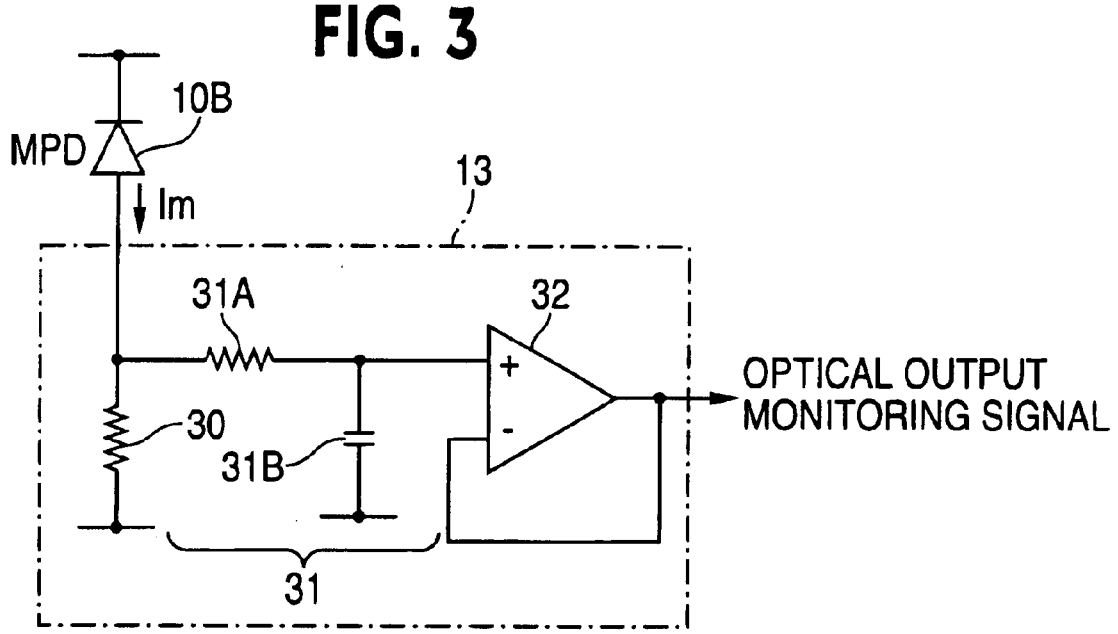
FIG. 3 is a circuit diagram showing a specific constitution example of an optical output monitoring signal generating section to be used in the optical transmitter of FIG. 1.

Such as shown in a circuit diagram of FIG. 3, the optical output monitoring signal generating section 13 includes a resistor 30 for converting the monitoring current Im output from the monitoring PD 10B, into a voltage, a resistor 31 a and a capacitor 31B cooperatively acting as a low-pass filter 31 for smoothing the converted voltage signal, and an operational amplifier 32 as a buffer for amplifying an output signal from the low-pass filter 31 at a gain of one times, to output an output signal from the operational amplifier 32 as the optical output monitoring signal to the main signaling section 11. Thus, the monitoring PD 10B and optical output monitoring signal generating section 13 cooperatively exhibit a function as an optical output detecting section.

The temperature sensor 14 in FIG. 1 measures the temperature at an arbitrary portion on the optical transmitter 1 (such as an LSI integrating the LD module 10 and main signaling section 11), to output a measurement result as a temperature monitoring signal to the main signaling section 11.

There will be now specifically explained the temperature characteristics concerning the modulation current Imod and threshold current Ith of the laser diode 10A, and the monitoring current Im of the monitoring PD 10B.

Figure 4:
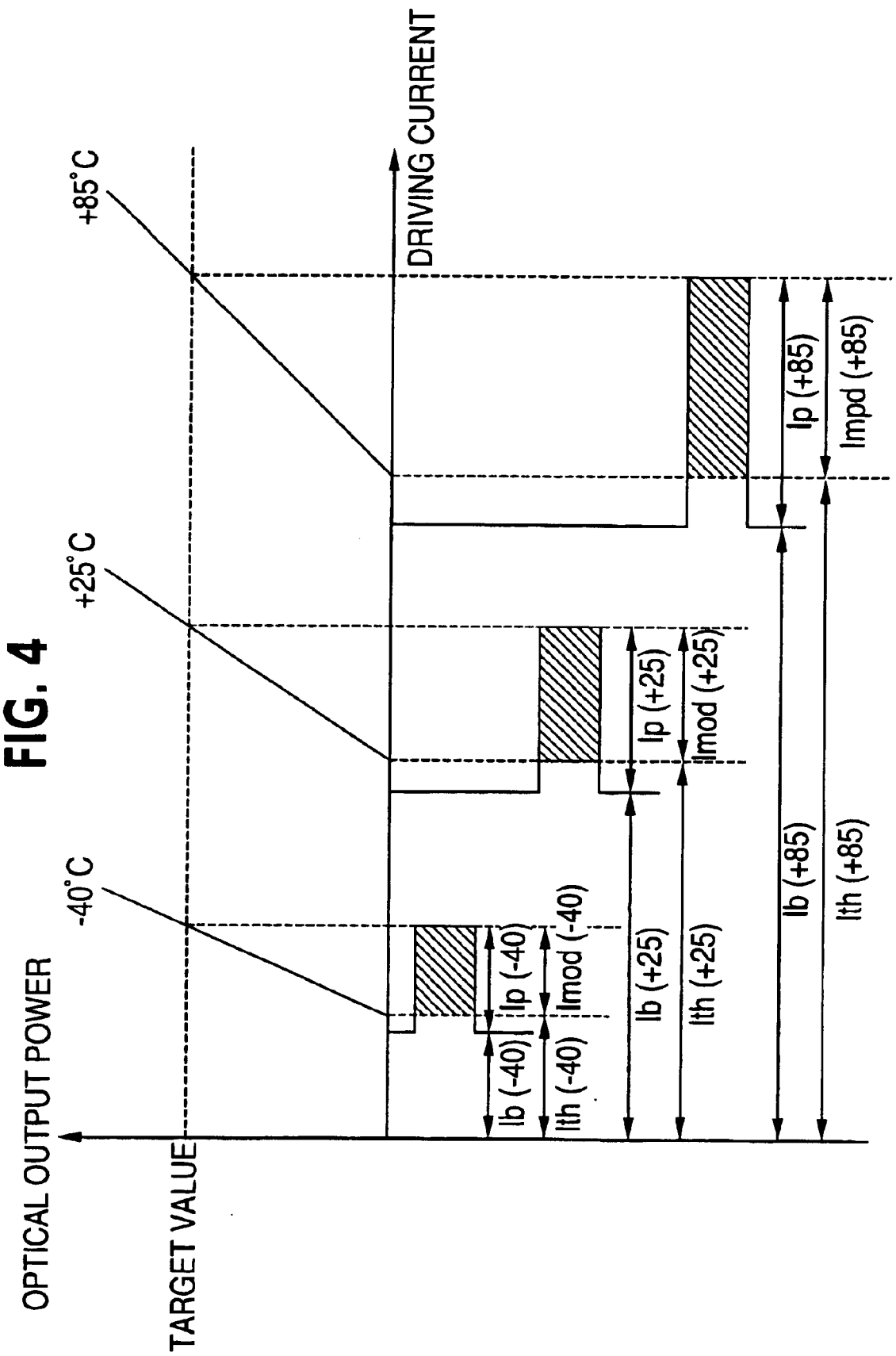
FIG. 4 is a view explaining temperature characteristics of a typical laser diode.

FIG. 4 is a view explaining temperature characteristics of a typical laser diode, and shows a relationship of an optical output power to a driving current, where the ambient temperature of the laser diode is changed to −40° C., +25° C., and +85° C., respectively.

As shown in FIG. 4, it is necessary to increase the driving current with the rise of the ambient temperature, in order to obtain a required optical output power. The driving current at each temperature can be represented by the sum of the threshold currant Ith and modulation current Imod of the laser diode; or the sum of a threshold current Ib (=k×Ith; k≦1.0) and a modulation current Ip (=Imod+(1−k)×Ith) which have been corrected in view of such as a deterioration of light extinction and a delay in light emission of the laser diode. Such as shown by the middle and upper sections in FIG. 5, respective change amounts of the threshold current Ith (or Ib) and the modulation current Imod (or Ip) relative to a change in the ambient temperature are different from each other. Thus, as the temperature characteristic information to be used for compensating for optical output fluctuations due to temperature changes, the storing section 12 is stored with the temperature characteristic data Ith(T) for the threshold current and the temperature characteristic data Imod(T) for the modulation current, corresponding to the required temperature range over which the usage of the optical transmitter 1 is assumed.

Figure 5:
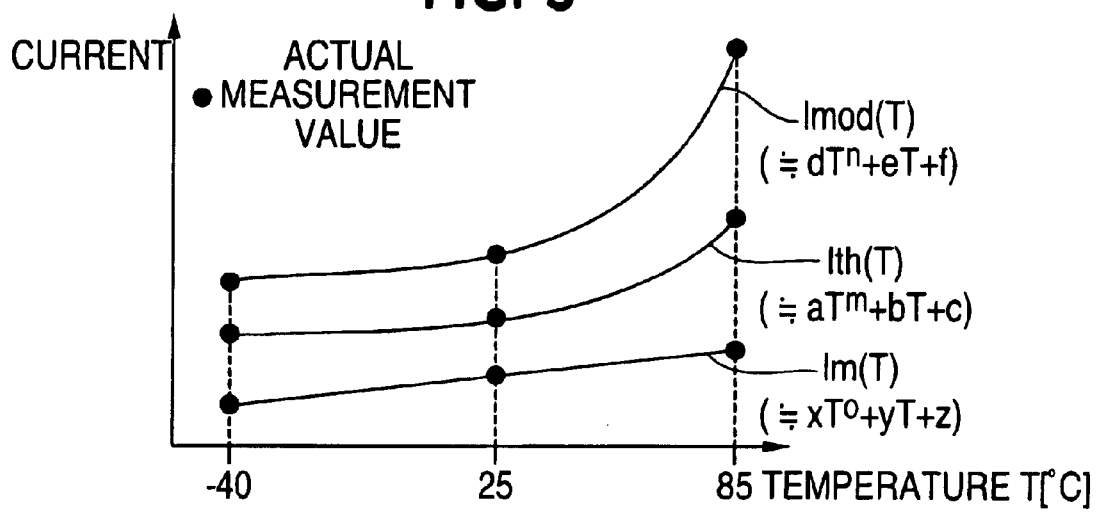
FIG. 5 is a view showing each example of temperature characteristic data of threshold current, modulation current and monitoring current, to be stored as the temperature characteristic information in the present invention.
Figure 12:
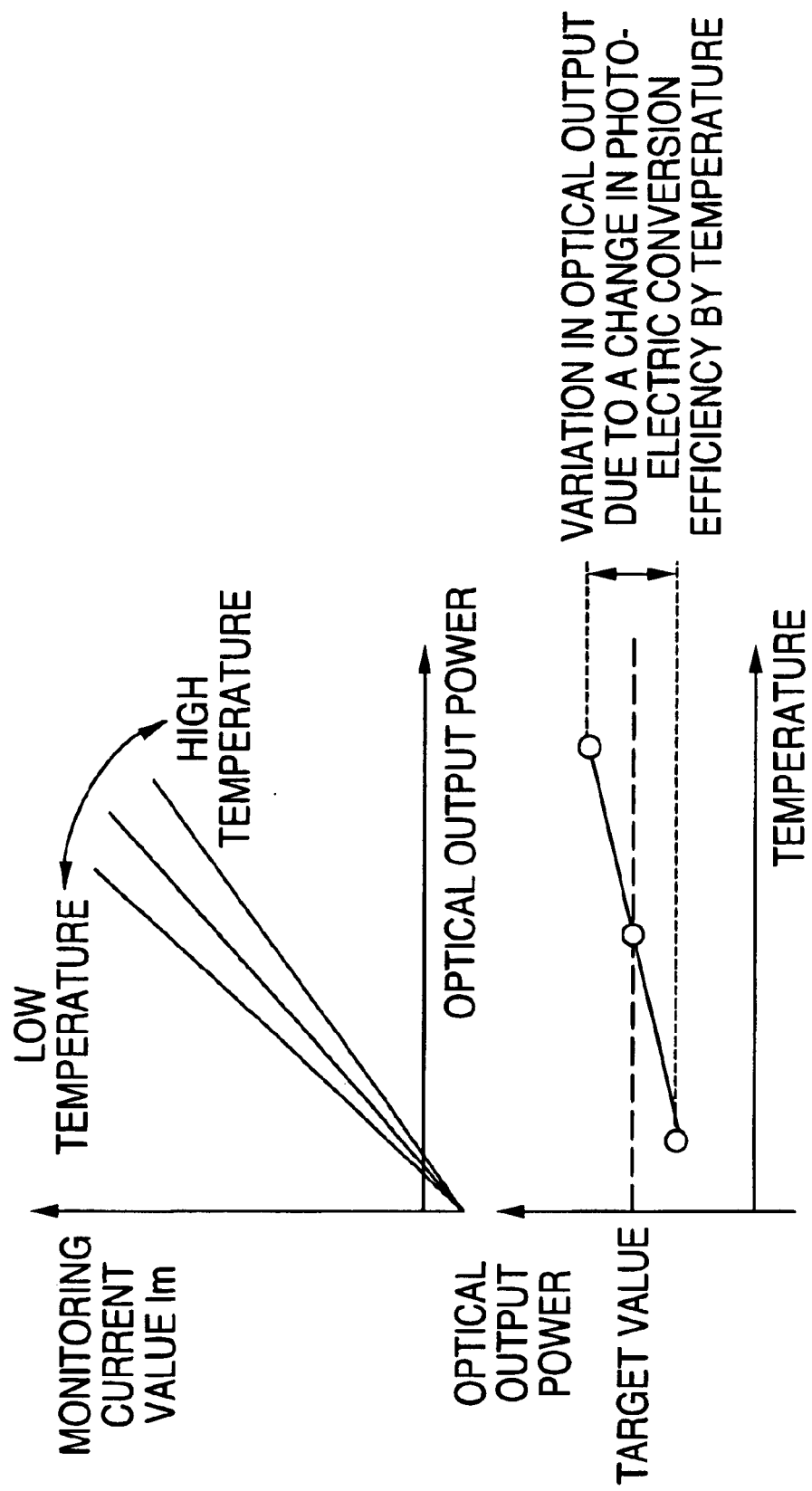
FIG. 12 is a view explaining a temperature change in a photoelectric conversion efficiency of a monitoring PD in a conventional optical transmitter.

Also concerning the monitoring current Im of the monitoring PD 10B, the photoelectric conversion efficiency of the monitoring PD is changed depending on the temperature as already explained with reference to FIG. 12, thereby causing a temperature characteristic as shown at the lower section of FIG. 5. Thus, in the present invention, the storing section 12 is also stored with the temperature characteristic data Im(T) for the monitoring current corresponding to the required temperature range, as the temperature characteristic information to be used for compensating for the optical output fluctuations due to temperature changes.

it is possible to obtain the respective temperature characteristic data Imod(T), Ith(T), Im(T) as illustrated in FIG. 5 to be stored as the temperature characteristic information in the storing section 12, as follows.

For example, assuming −40° C. to +85° C. as the working temperature range of the optical transmitter 1, firstly three points of −40° C., +25° C., and +85° C. are set as measuring temperatures, to measure threshold currents Ith(−40), Ith(+25), and Ith(+85). Next, at the respective temperatures, modulation currents Imod(−40), Imod(+25), Imod(+85) required to obtain targeted optical output powers are measured, in a state whore the above measured threshold currents Ith(−40). Ith(+25) and Ith(+85) are being flown to the laser diode 10A, respectively. Simultaneously with the measurement of the modulation currents Imod at the respective temperatures, there are also measured the monitoring currents Im(−40), Im(+25) and Im(+85) at the time when the targeted optical output powers are obtained, respectively.

Then, the coefficients a to c, d to f, x to z, of The following approximate expressions are calculated, by using electric current values measured at the respective temperatures. Note, the orders "m", "n" and "o" in the respective approximate expressions shall be previously set corresponding to respective characteristic curves.

$$Ith(T) \approx aT^m + bT + c \quad (1),$$

$$Imod(T) \approx dT^n + eT + f \quad (2), \text{ and}$$

$$Im(1) \approx xT^o + yT + z \quad (3).$$

Further, respective tables of the threshold current Ith, modulation current Imod and monitoring current Im over the working temperature range are created, by using the approximate expressions (1) through (3) applied with the above calculated coefficients, respectively, and these tables as the temperature characteristic information are stored in the storing section 12.

If the temperature characteristic information is created by utilizing the approximate expressions (1) through (3) in the above manner, the temperature characteristic information with a higher precision can be obtained oven with a relatively small number of measuring points (here, 3 points for each electric current value), thereby enabling to shorten the time required for adjusting the optical transmitter 1 and to realize a reduction in cost by virtue of the reduction of the number of adjusting steps.

Preferably, the temperature positions to be monitored when measuring the aforementioned temperature characteristic data are equated to the temperature positions to be monitored by the temperature sensor 14 in actually using the optical transmitter 1. Alternatively, when the temperature positions at the time of data measurement are different from the temperature positions at the time of actually using the optical transmitter 1, differences between the temperature positions when data measuring and the temperature positions when using the optical transmitter 1 may previously be measured so that the temperature characteristic information are obtained using approximate expressions for which the abscissas of the characteristic curves of FIG. 5 are shifted by such temperature differences, respectively, to thereby to store them into the storing section 12.

In the above method for obtaining the temperature characteristic information, by increasing the number of terms of each approximate expression and increasing the order, it is possible to obtain temperature characteristic information with a higher precision. Only, in this case, it is required to increase the number of temperature points to be measured.

In the above obtaining method, the electric current values at the respective temperatures have been actually measured, respectively. However, If the temperature characteristic data of the LD module 10 itself to be used in the optical transmitter 1 is available in advance, for example, the respective coefficients of the aforementioned approximate expressions may be calculated by using such data. In this way, it becomes possible to execute the data obtaining operation for the assembled optical transmitter 1 only at a certain temperature (such as an ordinary temperature), to thereby drastically shorten the adjusting time for the optical transmitter 1.

In the optical transmitter 1 in which the respective temperature characteristic data Ith(T). Imod(T), Im(T) of the threshold current, modulation current and monitoring current have been stored into the storing section 12 in the above manner, respectively, the main signaling section 11 reads out the temperature characteristic information in the storing section 12 corresponding to the optical output monitoring signal from the optical output monitoring signal generating section 13 and the temperature monitoring signal from the temperature sensor 14, to control the driving current such that tile optical output power of the laser diode 10A is kept constant at a targeted value. Herein, there shall be described the specific operation of the optical transmitter 1, assuming such a controlling system of the driving current in which the modulation current Imod is feedback controlled in accordance with the optical output monitoring signal and the threshold current Ith is feedforward controlled, in accordance with the temperature characteristic information corresponding to the temperature monitoring signal in the storing section 12, FIG. 6 is a conceptual view for explaining the operation of the optical transmitter 1 in the controlling system noted just above.

Figure 6:
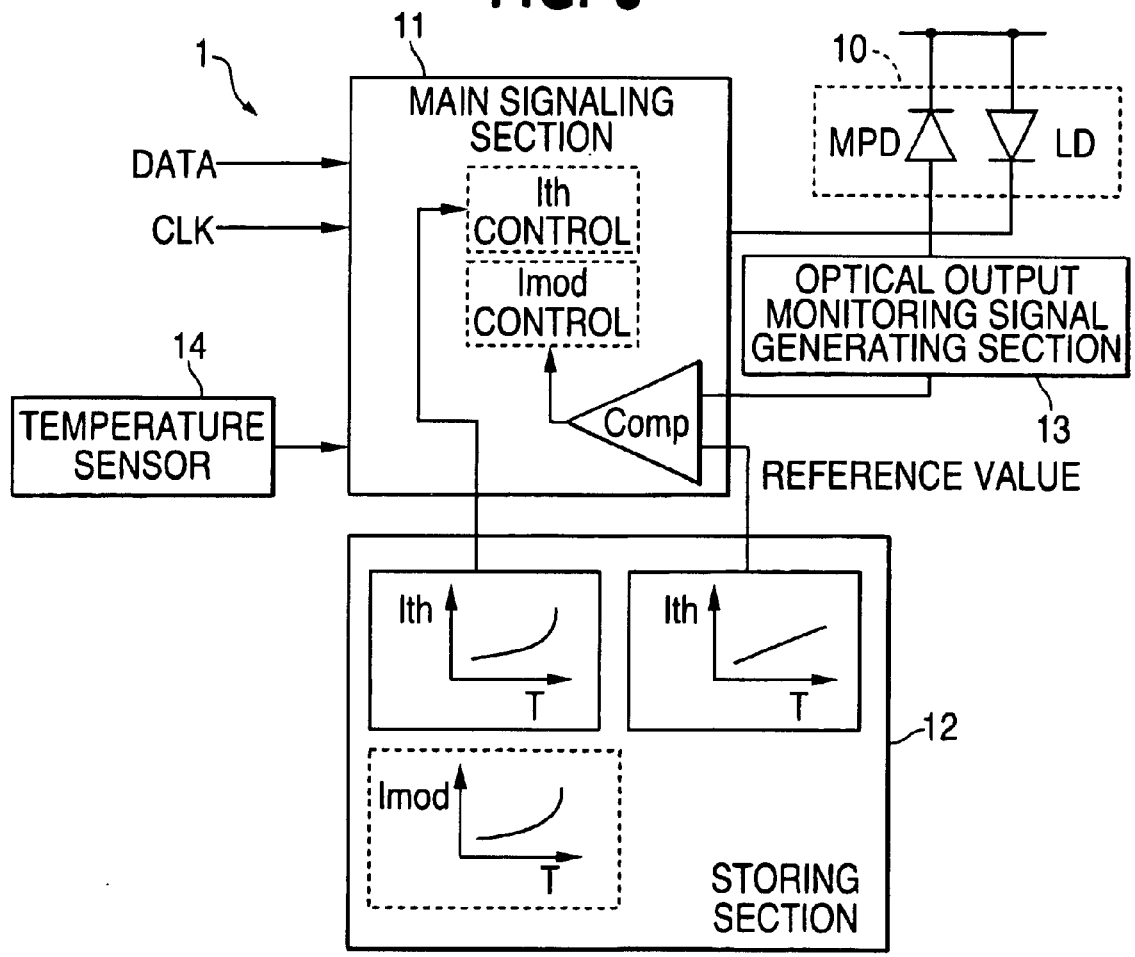
FIG. 6 is a conceptual view explaining an operation in case of feedforward controlling the threshold current and feedback controlling the modulation current in the present invention.

As shown in FIG. 6, at the optical transmitter 1, firstly, the temperature of a required site on the optical transmitter 1 monitored as the temperature monitoring signal by the temperature sensor 14 is sent to the processing circuit 20 of the main signaling section 11. At the processing circuit 20, the respective values of threshold current Ith(T), modulation current Imod(T) and monitoring current Im(T) corresponding to the input temperature monitoring signal are read out from the temperature characteristic information in the storing section 12. Then, a controlling signal for setting the read out threshold current Ith(T) to the initial value is sent to the threshold current controlling circuit 23 from the processing circuit 20, so that the laser diode 10A is supplied with the threshold current Ith controlled by the threshold current controlling circuit 23.

Next, the optical output monitoring signal output from the optical output monitoring signal generating section 13 is sent to the processing circuit 20. At the processing circuit 20, the feedback control of the modulation current Imod is performed making use of the optical output monitoring signal, with the value of the monitoring current Im read out from the storing section 12 as a reference value of the APC, To be specific, a difference between an actual measurement value and the reference value of the monitoring current Im is obtained, and a controlling signal for adjusting the modulation current Imod corresponding to the thus obtained difference is sent from the processing circuit 20 to the modulation current controlling circuit 22, to thereby feedback control the modulation current Imod flowing through the MOSFET 22C.

In such a controlling system, a target value of the monitoring current Im is read out corresponding to the temperature monitoring signal, to be set to the reference value of the feedback control (APD). Therefore, differently from the conventional, it becomes unnecessary to perform an initial adjustment of the reference value for the feedback control, so that even the fluctuation in the optical output power due to the change in temperature of the photoelectric conversion efficiency of the monitoring PD 10B can be compensated for. Thereby, it becomes possible to realize a low cost optical transmitter capable of controlling the optical output power with a high precision.

In the above controlling system, there has been assumed a situation where the threshold current Ith is feedforward controlled and the modulation current Imod is feedback controlled. However, the present invention is not limited thereto, and it is possible to adopt such a system for feedback controlling the threshold current Ith and feedforward controlling the modulation current Imod, or a system for feedback controlling both of the threshold current Ith and modulation current Imod.

Figure 7:
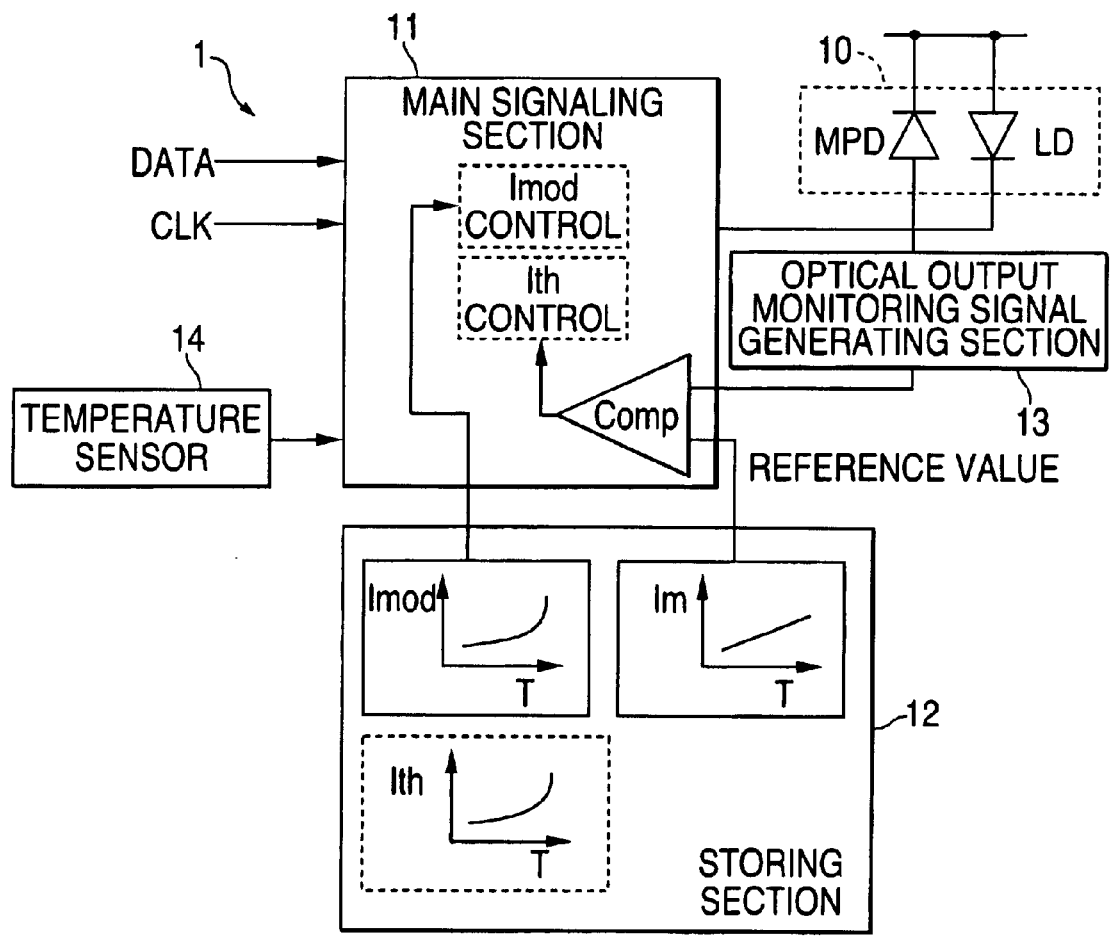
FIG. 7 is a conceptual view explaining an operation in case of feedback controlling the threshold current and feedforward controlling the modulation current in the present invention.

In a situation for feedback controlling the threshold current Ith and feedforward controlling the modulation current Imod, such as specifically shown in the conceptual view of FIG. 7, the modulation current Imod to be supplied to the laser diode 10A is set by directly using the value of the modulation current Imod read out from the storing section 12 corresponding to the temperature monitoring signal from the temperature sensor 14, and also, the feedback control of the threshold current Ith is performed making use of the optical output monitoring signal, with the value of the monitoring current Im read out from the storing section 12 corresponding to the temperature monitoring signal as the reference value of the APC.

Figure 8:
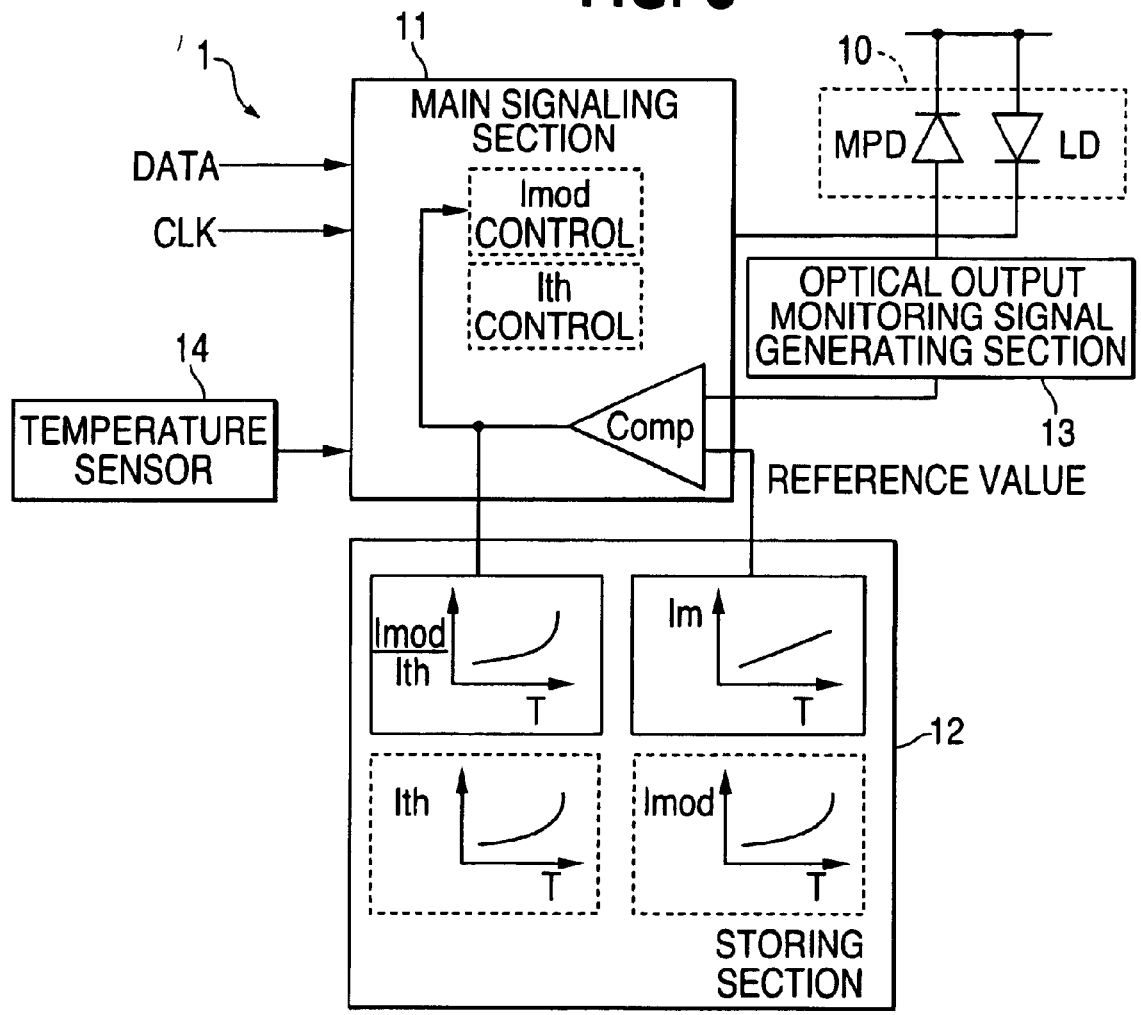
FIG. 8 is a conceptual view explaining an operation in case of feedback controlling both of the threshold current and modulation current in the present invention.

Further, in a situation for feedback controlling both of the threshold current Ith and Modulation current Imod, such as specifically shown in the conceptual view of FIG. 8, the feedback controlling of the threshold current Ith and modulation current Imod is performed with the value of the monitoring current Im read out from the storing section 12 corresponding to the temperature monitoring signal from the temperature sensor 14 as the reference value of the APC, so that a ratio (Imod/Ith) of modulation current Imod to threshold current Ith coincides with the temperature characteristic information corresponding to the temperature monitoring signal, Note, in the embodiment of FIG. 8, the temperature characteristic information concerning the Imod/Ith have been previously calculated by using the respective temperature characteristic data of the threshold current Ith and modulation current Imod, to be stored into the storing section 12. However, the values of the threshold current Ith and modulation current Imod corresponding to the temperature monitoring signal may be read out from the storing section 12, respectively, to calculate the value of Imod/Ith at the processing circuit 20 of the main signaling section 11 upon request. Thus, If the value of the Imod/Ith is calculated upon request, it is possible to reduce the capacity of the storing section 12 and to achieve the downsizing and lower cost of the circuit.

In the aforementioned controlling system of the driving current according to the present invention, the value of the monitoring current Im read out from the storing section 12 corresponding to the temperature monitoring signal is treated as the reference value of the APC, to feedback control at least one of the threshold current Ith and modulation current Imod. Such a controlling system is realizable, by a relatively simple circuit configuration as shown in FIG. 1 and FIG. 2.

Note, according to the constitution of the optical transmitter 1 of the present invention, it is also possible to cope with a system for feedforward controlling the threshold current Ith and modulation current Imod. In such a situation, however, the control making use of the monitored result at the monitoring PD 10B is not performed, to thereby make it difficult to compensate for the optical output fluctuation such as due to the time lapse deterioration and the like of the laser diode 10A .

There will be described hereinafter a more specific embodiment of the optical transmitter according to the present invention.

Figure 9:
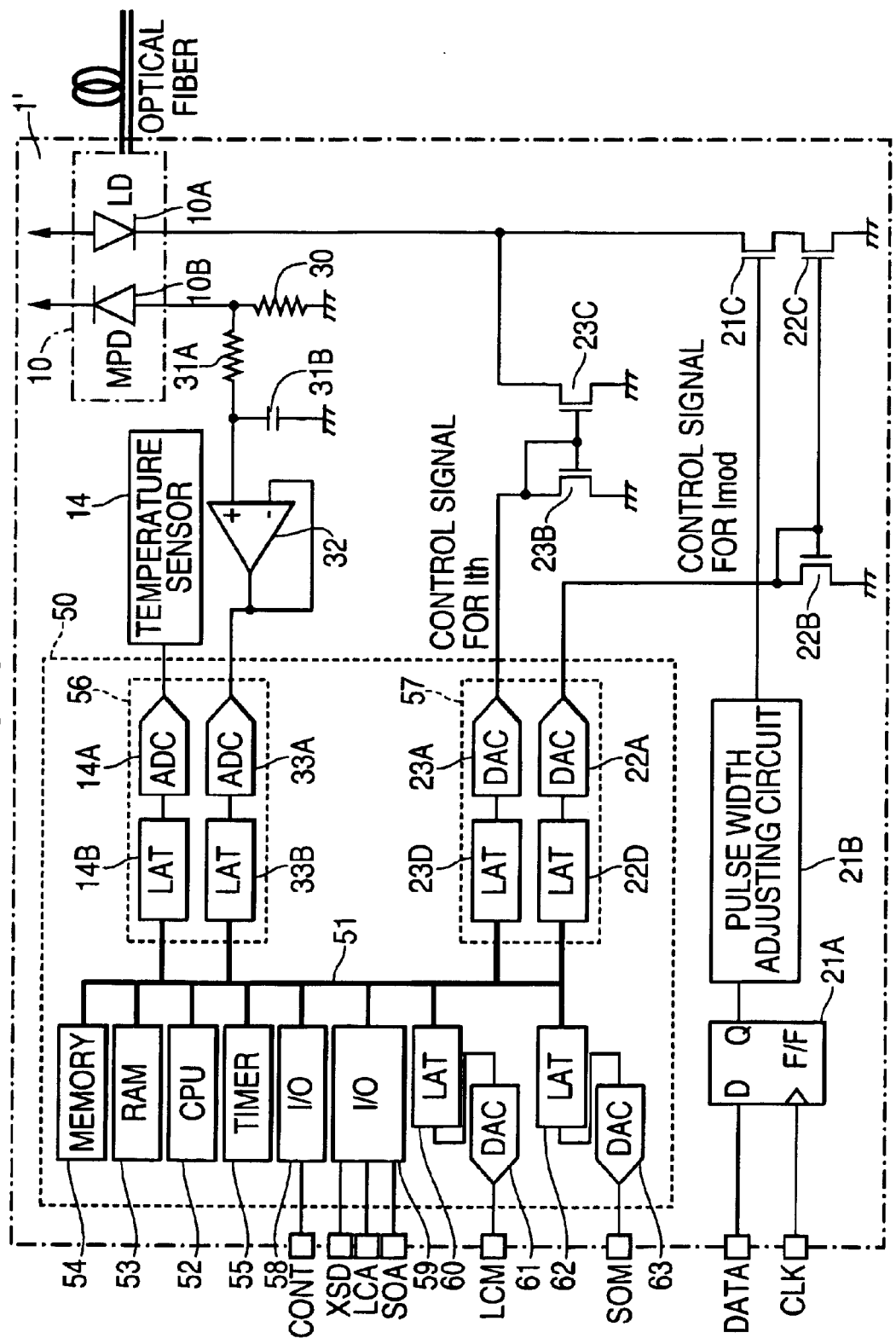
FIG. 9 is a circuit diagram showing a specific constitution example of the optical transmitter according to the present invention.

FIG. 9 is a circuit diagram showing a specific constitution example of an optical transmitter according to the present invention. Like reference numerals as used in the constitutions shown in FIG. 1 through FIG. 3 are used to denote corresponding or identical elements in FIG. 9.

In FIG. 9, an optical transmitter 1' comprises a typical microcomputer 50. This microcomputer 50 includes, for example a CPU 52, RAM 53, memory 54 and timer 55, respectively connected to a bus 51, an analogue/digital converting circuit 56 as an interface for the optical output monitoring signal generating section 13 and temperature sensor 14, and also has a digital/analogue converting circuit 57 as an interface for the modulation current controlling circuit 22 and threshold current controlling circuit 2, and I/O's 58, 59 as other interfaces.

The RAM 53 is used as a working area or a temporary storage area for data of the CPU 52. The memory 54 corresponds to the aforementioned storing section 12, and is an area for storing the temperature characteristic information such as previously obtained by measurement. The I/O 58 is a circuit for processing interface signals when performing, making use of such as exterior personal computers, the control of writing/reading the data into/from the memory 54, and writing/reading the information into/from various latch circuits (LAT's), and this I/O 58 adopts a typical serial transmission. Further, the I/O 59 is an interface for digital input/output signals, and this I/O 59 inputs a shut down controlling signal XSD from the exterior for forcibly shutting down the optical output of the optical transmitter 1', and outputs an alarm signal LCA for notifying an abnormal increase in the driving current to be calculated and output by the CPU 52, and an alarm signal SOA for notifying an abnormal deterioration of the optical output power and the like.

The analogue/digital converting circuit 56 is constituted of A/D converters 14A, 33A and latch circuits 14B 33B herein. The A/D converter 14A converts the temperature monitoring signal from the temperature sensor 14 into a digital signal, to output the converted signal to the latch circuit 14B. The latch circuit 14B latches an output signal from the A/D converter 14A to output the signal to the bus 51. Further, the A/D converter 33A converts the output signal from the optical output monitoring signal generating section 13 into a digital signal to output the converted signal to the latch circuit 33B. The latch circuit 33B latches an output signal from the A/D converter 33A to output the signal to the bus 51.

The digital/analogue Converting circuit 57 is constituted of latch circuits 22D, 23D and D/A converters 22A, 23A, herein. The latch circuit 22D latches the controlling signal concerning the modulation current Imod output from the bus 51, to output the controlling signal to the D/A converter 22A. The D/A converter 22A converts an output signal from the latch circuit 22D into an analog signal, to output the converted signal to the diode-connected MOSFET 22B. Further, the latch circuit 23D latches the controlling signal concerning the threshold current Ith output from the bus 51, to output the controlling signal to the D/A converter 23A. The D/A converter 23A converts an output signal from the latch circuit 23D into an analog signal, to output the converted signal to the diode-connected MOSFET 23B.

Figure 10:
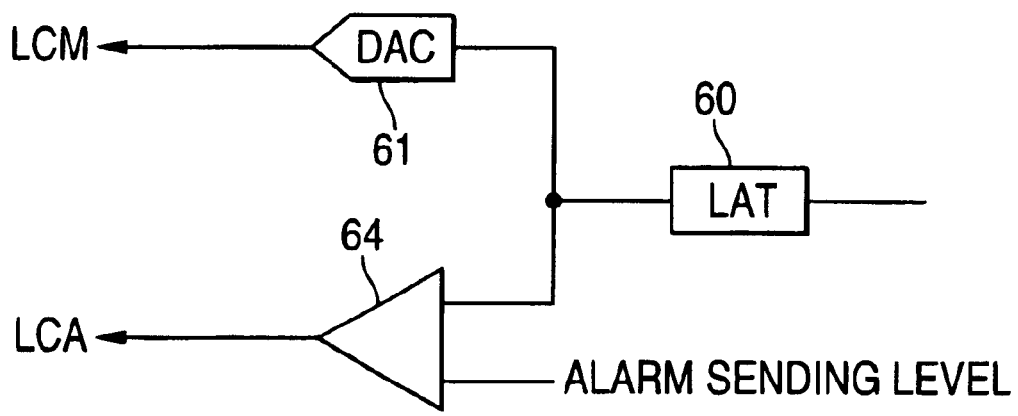
FIG. 10 is a view showing an example of a situation where a function for sending an alarm when there occurs an abnormality in the driving current is provided for the optical transmitter of FIG. 9.

The microcomputer 50 of this optical transmitter 1' is provided with latch circuits 60, 62 an D/A converters 61, 63, so as to output the driving state to the exterior. The latch circuit 60 latches a ratio between the sum of the modulation current Imod and threshold current Ith stored in the latch circuits 22D, 23D, respectively, to be controlled by the CPU 52, and the sum of the initial values of the modulation current Imod and threshold current Ith stored in the memory 54, to output this ratio to the D/A converter 61. The D/A converter 61 converts an output signal from the latch circuit 60 into an analog signal, to output the converted signal as a monitoring signal LCM indicative of the controlling state of the driving current to the exterior. Further, such as shown in FIG. 10, the optical transmitter 1' may be provided with a function to compare, by an operation circuit 64, the output signal level of the latch circuit 60 with an alarm sending level previously set for judging an abnormality (deterioration) in the driving current, to send an alarm LCA when there occurs an abnormality in the driving current.

Figure 11:
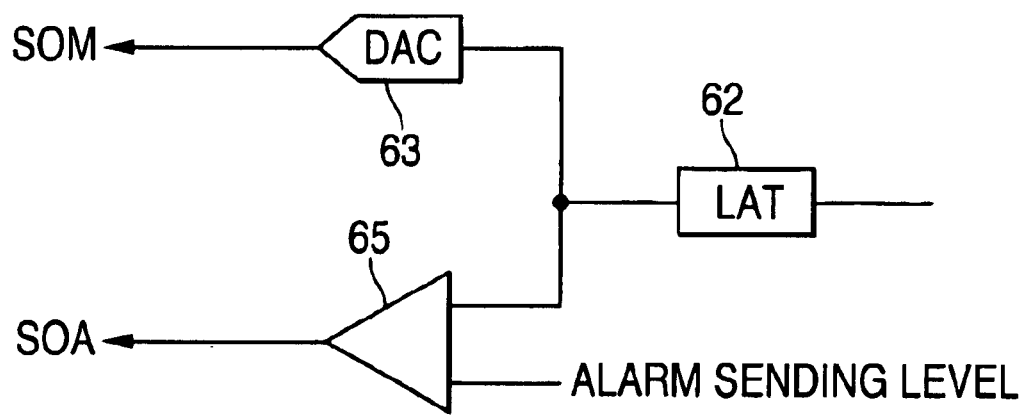
FIG. 11 is a view showing an example of a situation where a function for sending an alarm when there occurs an abnormality in the optical output power is provided for the optical transmitter of FIG. 9.

The latch circuit 62 latches a ratio between a signal corresponding to the monitoring current Im of the optical output stored in the latch circuit 33B and an initial value of the monitoring current Im stored in the memory 54, to output this ratio to the D/A converter 63. The D/A converter 63 converts an output signal from the latch circuit 62 into an analog signal, to output the converted signal as a monitoring signal SOM indicative of the controlling state of the optical output power to the exterior. Further, such as shown in FIG. 11, the optical transmitter 1' may be provided with a function to compare, by an operation circuit 65, the output signal level of the latch circuit 62 with an alarm sending level previously set for judging an abnormality (deterioration) in the optical output power, to send an alarm SOA when there occurs an abnormality in the optical output power.

According to the optical transmitter 1' having the above constitution, the same functions and effects can be obtained as the aforementioned optical transmitter 1, and it is further possible to monitor, from the exterior of the optical transmitter 1', the states of the latch circuits 22D, 23D, 33B by the monitoring signal. LCM, SOM output via the latch circuits 60, 62 and D/A converters 61, 63, and to alert an occurrence of an abnormality (deterioration) of the driving current or optical output power, to the exterior. In this way, such a circuit for monitoring the controlling state of the driving current or optical output power to thereby send an alarm when there occurs an abnormality can be certainly realized even by a conventional circuit configuration, by additionally providing analog circuits for monitoring the threshold current Ith or modulation current Imod to be supplied to the laser diode or the monitoring current Im to be output from the monitoring PD. However, such analog circuits have larger errors due to variations among circuit parts such as absolute value deviation of current mirrors and resistors as well as offset of comparator, Thus, it is required to perform an initial adjustment for correcting such errors for each optical transmitter, to thereby increase the number of adjusting steps and require circuit parts such as resistors and comparators, thereby defectively resulting in an increase in circuit size. Contrary, according to the present invention, the monitoring of the driving current and optical output power and the sending of the alarm are performed such that the information of the feedback controlled driving current and the information or the monitoring current Im output from the monitoring PD are compared with the temperature characteristic information stored in the memory 54, the comparison result is output as the monitoring signal, and this comparison result is further compared with the alarm sending level to be sent as an alarm when there occurs an abnormality. Thus, the output of the monitoring signal and the sending of the alarm are realized by only the comparing operation of various information to be processed by the microcomputer 50, thereby it becomes possible to avoid the disadvantage in the aforementioned conventional circuit.

Note, since irrespectively of the controlling system of the driving current, it is possible to perform a comparison procedure of the monitoring output of the optical output power and the monitoring current Im for the alarm sending, this comparison procedure is effective for both the feedforward control and the feedback control of the driving current.

In the aforementioned embodiments, there have been described situations adopting a laser diode as a semiconductor light emitting device. However, the present invention is not limited thereto, and can be also applied to an optical transmitter utilizing a light emitting diode (LED). In such a situation, the modulation shall be performed by driving the LED in a region of a threshold current or less in a laser diode.

According to the present invention, the respective temperature characteristic data concerning the driving current of The semiconductor light emitting device and concerning the optical output detecting section are stored as temperature characteristic information into the storing section, and the driving current is controlled by utilizing the temperature characteristic information. Thereby, it becomes possible to provide a low cost optical transmitter capable of controlling with a high precision an optical output power of the semiconductor light emitting device. The controlling technique of the present invention for the semiconductor light emitting device can be applied to various optical transmitters such as used in an optical communication field, and has a great industrial applicability.

What is claimed:

1. An optical transmitter comprising:
    a semiconductor light emitting device;
    a driving circuit supplying a driving current to said semiconductor light emitting device;
    an optical output detecting section detecting an optical output power of said semiconductor light emitting device;
    a controlling section controlling the operation of said driving circuit based on a detection result of said optical output detecting section;
    a storing section storing temperature characteristic information including temperature characteristic data concerning the driving current to be supplied to said semiconductor light emitting device and temperature characteristic data concerning a photoelectric conversion efficiency of said optical output detecting section; and
    a temperature detecting section detecting temperature,
    wherein said controlling section controls the operation of said driving circuit, based on the temperature characteristic information read out from said storing section corresponding to the temperature detected by said temperature detecting section and based on the detection result of said optical output detecting section.

2. An optical transmitter according to claim 1:
    said semiconductor light emitting device is a laser diode; and
    said storing section stores therein, as the temperature characteristic information, temperature characteristic data corresponding to a threshold current to be supplied to said laser diode, temperature characteristic data corresponding to a modulation current to be supplied to said laser diode, and temperature characteristic data of a monitoring current to be output from a light receiving element to be used in said optical output detecting section.

3. An optical transmitter according to claim 2, wherein said controlling section feedback controls at least one of the threshold current and the modulation current to be supplied from said driving circuit to said laser diode, such that the temperature characteristic data of the monitoring current read out from said storing section corresponding to the temperature detected by said temperature detecting section, coincides with a monitoring current value corresponding to the optical output power detected by said optical output detecting section.

4. An optical transmitter comprising:
    a semiconductor light emitting device;
    a driving circuit supplying a driving current to said semiconductor light emitting device;
    an optical output detecting section detecting an optical output power of said semiconductor light emitting device;
    a controlling section controlling the operation of said driving circuit based on a detection result of said optical output detecting section;
    a storing section storing temperature characteristic information including temperature characteristic data concerning the driving current to be supplied to said semiconductor light emitting device and temperature characteristic data concerning said optical output detecting section; and
    a temperature detecting section detecting temperature, wherein:
        said controlling section controls the operation of said driving circuit, based on the temperature characteristic information read out from said storing section corresponding to the temperature detected by said temperature detecting section and based on the detection result of said optical output detecting section;
        said semiconductor light emitting device is a laser diode;
        said storing section stores therein, as the temperature characteristic information, temperature characteristic data corresponding to a threshold current to be supplied to said laser diode, temperature characteristic data corresponding to a modulation current to be supplied to said laser diode, and temperature characteristic data of a monitoring current to be output from a light receiving element to be used in said optical output detecting section;
        said controlling section feedback controls at least one of the threshold current and the modulation current to be supplied from said driving circuit to said laser diode, such that the temperature characteristic data of the monitoring current read out from said storing section corresponding to the temperature detected by said temperature detecting section, coincides with a monitoring current value corresponding to the optical output power detected by said optical output detecting section; and
        said controlling section, when both the threshold current and modulation current are feedback controlled, calculates a ratio between the threshold current and the modulation current using the temperature characteristic information read out from said storing section corresponding to the temperature detected by said temperature detecting section, to control the operation of said driving such that a value of a ratio between the threshold current and the modulation current is optimized at each temperature.

5. An optical transmitter according to claim 4, wherein said storing section stores temperature characteristic information concerning the ratio between the threshold current and the modulation current.

6. An optical transmitter according to claim 2, wherein said controlling section feedforward controls one of the threshold current and the modulation current to be supplied from said driving circuit to said laser diode, based on only the temperature characteristic information read out from said storing section corresponding to the temperature detected by said temperature detecting section.

7. An optical transmitter according to claim 1, wherein said semiconductor light emitting device is a light emitting diode.

8. An optical transmitter according to claim 1, wherein the temperature characteristic information to be stored in said storing section is obtained by utilizing approximate expressions defined based on data measured for at least three temperatures over a working temperature range.

9. An optical transmitter according to claim 1, further comprising a driving current monitoring circuit capable of detecting an increase or decrease in the driving current to be supplied to said semiconductor light emitting device, by comparing the data corresponding to the temperature detected by said temperature detecting section, among the temperature characteristic data concerning the driving current stored in said storing section, with the driving current generated by said driving circuit.

10. An optical transmitter according to claim 1, further comprising an optical output monitoring circuit capable of detecting a fluctuation in the optical output power of said semiconductor light emitting device, by comparing the data corresponding to the temperature detected by said temperature detecting section, among the temperature characteristic data concerning said optical output detecting section stored in said storing section, with the information concerning the optical output power detected by said optical output detecting section.

11. An optical transmitter comprising:
  a light emitting device;
  a driving circuit supplying a drive signal to said light emitting device;
  an optical detector detecting an optical output of said light emitting device and providing an output;
  a controller controlling the operation of said driving circuit based on the output of said optical detector;
  a storage storing temperature characteristic information including temperature characteristic data concerning the drive signal to be supplied to said light emitting device and temperature characteristic data concerning a photoelectric conversion efficiency of the optical detector; and
  a temperature detector, detecting temperature and providing an output,
  said controller controlling the operation of said driving circuit based on the output of said temperature detector, the output of said optical detector, and the stored temperature characteristic information corresponding to the temperature detected by said temperature detector.

12. A method of controlling an optical transmitter having a light emitting device which is supplied with a drive signal, comprising:
  detecting an optical output of the light emitting device by using an optical detector;
  storing temperature characteristic information including temperature characteristic data concerning the drive signal to be supplied to the light emitting device and temperature characteristic data concerning a photoelectric conversion efficiency of the optical detector;
  detecting a temperature;
  controlling the drive signal based on the temperature detected by the temperature detector, the detected optical output, and the stored temperature characteristic information corresponding to the detected temperature.

* * * * *

UNITED STATES PATENT AND TRADEMARK OFFICE
CERTIFICATE OF CORRECTION

PATENT NO.     : 6,748,181 B2
DATED          : June 8, 2004
INVENTOR(S)    : Makoto Miki et al.

It is certified that error appears in the above-identified patent and that said Letters Patent is hereby corrected as shown below:

<u>Title page,</u>
Item [57], ABSTRACT,
Line 1, please change "alms" to -- aims --.

Signed and Sealed this

Twenty-first Day of September, 2004

JON W. DUDAS
*Director of the United States Patent and Trademark Office*